United States Patent
Lin et al.

(10) Patent No.: US 10,446,489 B2
(45) Date of Patent: Oct. 15, 2019

(54) INTERCONNECT STRUCTURE

(71) Applicant: UNITED MICROELECTRONICS CORP., Hsin-Chu (TW)

(72) Inventors: Ko-Wei Lin, Taichung (TW);
Hung-Miao Lin, Yunlin County (TW);
Chun-Ling Lin, Tainan (TW);
Ying-Lien Chen, Chiayi (TW);
Huei-Ru Tsai, Kaohsiung (TW);
Sheng-Yi Su, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/170,059

(22) Filed: Oct. 25, 2018

(65) Prior Publication Data
US 2019/0067184 A1 Feb. 28, 2019

Related U.S. Application Data

(62) Division of application No. 15/466,847, filed on Mar. 22, 2017, now Pat. No. 10,153,231.

(30) Foreign Application Priority Data

Mar. 9, 2017 (CN) .......................... 2017 1 0137691

(51) Int. Cl.
*H01L 23/528* (2006.01)
*H01L 21/285* (2006.01)
*H01L 21/768* (2006.01)
*H01L 23/532* (2006.01)
*H01L 23/522* (2006.01)

(52) U.S. Cl.
CPC ...... *H01L 23/528* (2013.01); *H01L 21/28556* (2013.01); *H01L 21/28562* (2013.01); *H01L 21/76834* (2013.01); *H01L 21/76849* (2013.01); *H01L 21/76856* (2013.01); *H01L 21/76871* (2013.01); *H01L 23/5226* (2013.01); *H01L 23/53228* (2013.01); *H01L 23/53238* (2013.01); *H01L 23/53295* (2013.01)

(58) Field of Classification Search
CPC ............ H01L 23/532; H01L 23/53204; H01L 23/53209; H01L 23/53228; H01L 23/5226; H01L 21/76877; H01L 21/76849; H01L 21/76879
See application file for complete search history.

(56) References Cited

U.S. PATENT DOCUMENTS

| 9,406,556 | B2 | 8/2016 | Kolics | |
| 9,748,169 | B1* | 8/2017 | Murray | ............... H01L 23/5226 |
| 2014/0264922 | A1* | 9/2014 | Chen | ................... H01L 23/5226 257/774 |
| 2014/0332960 | A1* | 11/2014 | Yang | .................... H01L 21/768 257/751 |
| 2016/0133563 | A1 | 5/2016 | Al | |

OTHER PUBLICATIONS

Guo-Wei Chen et al., "New CoCap Package for VRDB Enhancement", Invention Disclosure, Jun. 30, 2015, p. 1-14.

* cited by examiner

*Primary Examiner* — David C Spalla
(74) *Attorney, Agent, or Firm* — Winston Hsu

(57) ABSTRACT

An interconnect structure includes a dielectric layer and a conductor embedded in the dielectric layer. A top surface of the conductor is flush with a top surface of the dielectric layer. A cobalt cap layer is deposited on the top surface of the conductor. A nitrogen-doped cobalt layer is disposed on the cobalt cap layer.

8 Claims, 4 Drawing Sheets

INTERCONNECT STRUCTURE

CROSS REFERENCE TO RELATED APPLICATIONS

This application is a division of U.S. application Ser. No. 15/466,847 filed Mar. 22, 2017, which itself claims the priority from CN application No. 201710137691.3, filed Mar. 9, 2017. The above-mentioned applications are included in their entirety herein by reference.

BACKGROUND OF THE INVENTION

1. Field of the Invention

The present invention relates to the field of semiconductor technology. More particular, the present invention relates to an improved interconnect structure.

2. Description of the Prior Art

In the semiconductor chips, the interconnect structures formed in the dielectric layer is responsible for the signal transmission. The electronic components formed on the semiconductor substrate, for example, transistors or memory cells, need to be connected to the external circuits via the interconnect structures.

Since copper is a better conductor than aluminum, most of the interconnect structures in semiconductor chips have been fabricated using copper processes, or so-called copper damascene processes. The transition from aluminum to copper required significant developments in fabrication techniques, including radically different methods for patterning the metal as well as the introduction of barrier metal layers to isolate the silicon from potentially damaging copper atoms.

Typically, after completion of the copper damascene process, a cobalt cap layer is typically formed on the copper surface, for example, by sputtering, and then an etch stop layer is deposited. However, although the cobalt cap layer has a good bonding with copper, the bonding property with the etch stop layer is poor, so that there is still a reliability problem.

SUMMARY OF THE INVENTION

It is one object of the present invention to provide an improved interconnect structure and a method for fabricating the same to solve the above-mentioned drawbacks and shortcomings of the prior art.

According to one embodiment, an interconnect structure includes a dielectric layer, a conductor embedded in the dielectric layer, a cobalt cap layer disposed on the top surface of the conductor, and a nitrogen doped cobalt layer disposed on the cobalt cap layer. The top surface of the conductor is flush with the top surface of the dielectric layer. The nitrogen doped cobalt layer has a gradient doping profile across a thickness of the nitrogen doped cobalt layer.

According to another embodiment, an interconnect structure includes a dielectric layer, a conductor embedded in the dielectric layer, a cobalt cap layer disposed on the top surface of the conductor, and a nitrogen doped cobalt layer disposed on the cobalt cap layer. The top surface of the conductor is flush with a top surface of the dielectric layer. The nitrogen doped cobalt layer has a uniform doping profile across a thickness of the nitrogen doped cobalt layer.

According to still another embodiment, a method of fabricating an interconnect structure is disclosed. A substrate having a dielectric layer thereon and a conductor embedded in the dielectric layer is provided. The top surface of the conductor is flush with the top surface of the dielectric layer. A cobalt cap layer is deposited on the top surface of the conductor. A surface treatment process is performed to dope nitrogen into the cobalt cap layer thereby forming a nitrogen-doped cobalt layer.

These and other objectives of the present invention will no doubt become obvious to those of ordinary skill in the art after reading the following detailed description of the preferred embodiment that is illustrated in the various figures and drawings.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the invention.

Before the further description of the preferred embodiment, the specific terms used throughout the text will be described below.

The term "etch" is used herein to describe the process of patterning a material layer so that at least a portion of the material layer after etching is retained. For example, it is to be understood that the method of etching silicon involves patterning a mask layer (e.g., photoresist or hard mask) over silicon and then removing silicon from the area that is not protected by the mask layer. Thus, during the etching process, the silicon protected by the area of the mask will remain.

In another example, however, the term "etch" may also refer to a method that does not use a mask, but leaves at least a portion of the material layer after the etch process is complete. The above description is used to distinguish between "etching" and "removal". When "etching" a material layer, at least a portion of the material layer is retained after the end of the treatment. In contrast, when the material layer is "removed", substantially all the material layer is removed in the process. However, in some embodiments, "removal" is considered to be a broad term and may include etching.

The terms "forming", "depositing" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

According to various embodiments, for example, deposition may be carried out in any suitable known manner. For example, deposition may include any growth, plating, or transfer of material onto the substrate. Some known techniques include physical vapor deposition (PVD), chemical vapor deposition (CVD), electrochemical deposition (ECD), molecular beam epitaxy (MBE), atomic layer deposition (ALD), and plasma enhanced CVD (PECVD).

The term "substrate" described in the text is commonly referred to as a silicon substrate. However, the substrate may also be any semiconductor material, such as germanium, gallium arsenide, indium phosphide and the like. In other embodiments, the substrate may be non-conductive, such as glass or sapphire wafers.

FIG. 1 to FIG. 6 are schematic, cross-sectional diagrams showing a method for fabricating an interconnect structure according to one embodiment of the invention.

Figure 1:
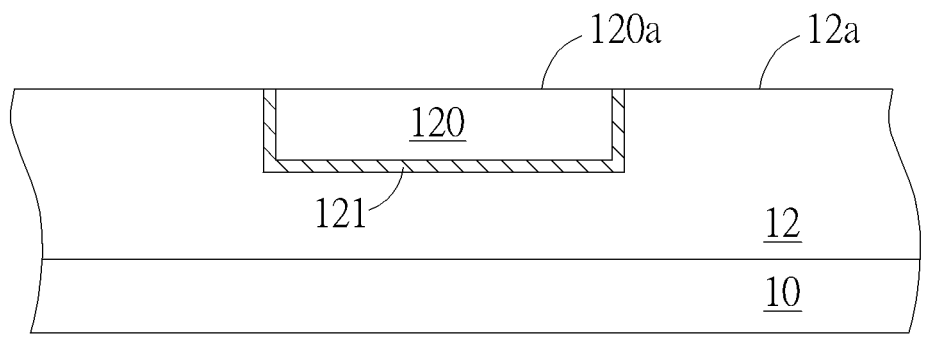
FIG. 1 to FIG. 6 are schematic, cross-sectional diagrams showing a method for fabricating an interconnect structure according to one embodiment of the invention.

As shown in FIG. 1, first, a substrate 10 is provided, wherein the substrate 10 may include, but is not limited to, a silicon substrate, a silicon-containing substrate, silicon-on-gallium nitride (or silicon on other materials of the Group III-V), graphene-on-silicon substrate, or a silicon-on-insulator (SOI) substrate. Semiconductor devices such as transistors may be formed on the substrate 10.

According to an embodiment of the present invention, a dielectric layer 12 is formed on the substrate 10. According to an embodiment of the present invention, the dielectric layer 12 may comprise a material having a low dielectric constant (k value less than 5) or a material having an ultra low dielectric constant (k value less than 3). For example, the dielectric layer 12 may comprise silicon dioxide, fluorine-doped silicon dioxide, a porous dielectric layer, and the like.

According to an embodiment of the present invention, a conductor 120 is buried in the dielectric layer 12. The conductor 120 is polished by a chemical mechanical polishing (CMP) process such that a top surface 120a of the conductor 120 is flush with a top surface 12a of the dielectric layer 12. According to an embodiment of the present invention, the conductor 120 comprises copper, for example, a damascened copper wire formed by a copper damascene process.

According to an embodiment of the present invention, the conductor 120 is encased by a barrier layer 121 to avoid diffusion of copper into the dielectric layer 12. According to an embodiment of the present invention, the barrier layer 121 may comprise tantalum or tantalum nitride, but is not limited thereto. Copper damascene processes are well-known art, so the details thereof are omitted.

Figure 2:
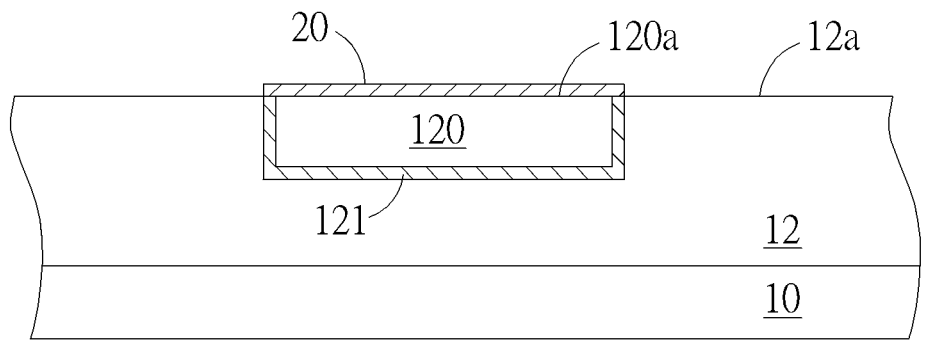

As shown in FIG. 2, a cobalt cap layer 20 with a thickness of about 50 to 150 angstroms is then selectively deposited on the top surface 120a of the conductor 120. According to an embodiment of the present invention, the cobalt cap layer 20 may be formed using a chemical vapor deposition (CVD) process. The cobalt cap layer 20 is selectively deposited on the top surface 120a of the conductor 120 and is not substantially deposited on the top surface 12a of the dielectric layer 12.

For example, several cobalt-containing precursor adsorption (also referred to as D) steps incorporated with several hydrogen reduction (also referred to as T) steps may be carried out using a cobalt CVD reactor (e.g., a cobalt CVD tool manufactured by Applied Materials, Inc.) until the top surface 120a of the conductor 120 is completely covered with a cobalt layer. For example, the thickness of the desired cobalt cap layer 20 may be deposited using a 3D3T cycle or a 3D2T cycle.

The above-described 3D3T cycle refers to three cobalt-containing precursor adsorption steps in combination with three hydrogen reduction steps, wherein each cobalt-containing precursor adsorption step is followed by a hydrogen-containing reduction step.

The above-described 3D2T cycle refers to three cobalt-containing precursor adsorption steps in combination with two hydrogen reduction steps, wherein each cobalt-containing precursor adsorption step is followed by a hydrogen-containing reduction step. The reaction ceases after the third cobalt-containing precursor adsorption step is completed and no hydrogen reduction step is carried out after the third cobalt-containing precursor adsorption step.

According to an embodiment of the present invention, the above-mentioned cobalt-containing precursor adsorption step may use an organometallic substance such as CoCOCp (chemical formula: $C_2H_5Co(CO)_2$) as a cobalt precursor, and the flow rate thereof may be in the range of 10 to 50 sccm. The hydrogen reduction step described above may be carried out at a flow rate of 1000 to 8000 sccm. During the reaction, the pressure in the reactor can be controlled at 5 to 40 torr and the temperature can be controlled at 150 to 300° C.

Figure 3:
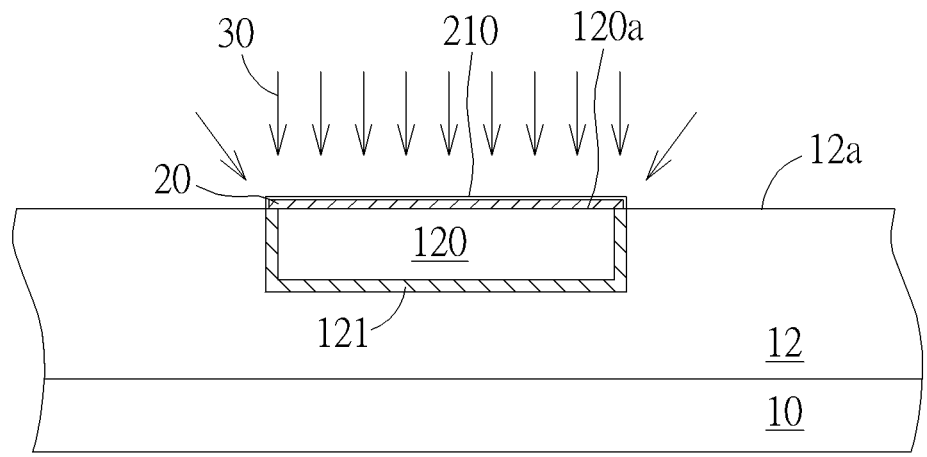

As shown in FIG. 3, after completion of the deposition process of the cobalt cap layer 20, a surface treatment process 30 is performed by implanting nitrogen into the cobalt cap layer 20, thereby forming a nitrogen-doped cobalt layer 210. According to an embodiment of the present invention, the thickness of the nitrogen-doped cobalt layer 210 may be in the range of 0 to 50 angstroms.

According to an embodiment of the present invention, the method of implanting the nitrogen into the cobalt cap layer 20 involves direct contact of the cobalt cap layer 20 with an ammonia gas plasma. The above-mentioned ammonia gas plasma may be generated by a remote plasma source and then introduced into a CVD reactor, but is not limited thereto. According to an embodiment of the present invention, a power of 0 to 1000 watt can be appropriately provided in the CVD reactor during the surface treatment process 30, but is not limited thereto.

Figure 4:
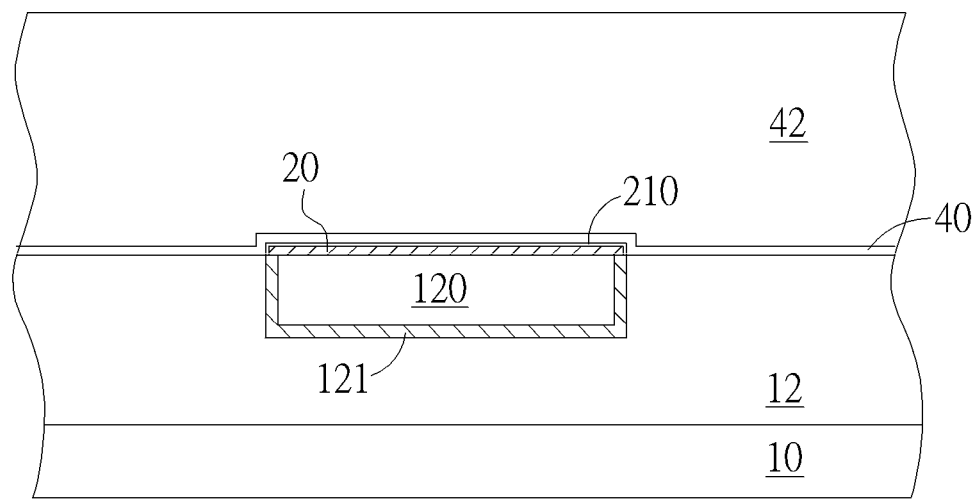

As shown in FIG. 4, an etch stop layer 40 is conformally deposited on the dielectric layer 12 and the nitrogen-doped cobalt layer 210. According to an embodiment of the present invention, the etch stop layer 40 may comprise SiCN, SiC, SiON, SiCON, or SiN, but is not limited thereto. Since the nitrogen-doped cobalt layer 210 has an excellent bonding property with the etch stop layer 40, a tightly bonding interface can be formed, so that the reliability of the interconnect structure can be improved.

Subsequently, a dielectric layer 42 is deposited on the etch stop layer 40. According to an embodiment of the present invention, the dielectric layer 42 may comprise a material having a low dielectric constant (k value less than 5) or a material having an ultra low dielectric constant (k value less than 3). For example, the dielectric layer 42 may comprise silicon dioxide, fluorine-doped silicon dioxide, a porous dielectric layer, and the like.

Figure 5:
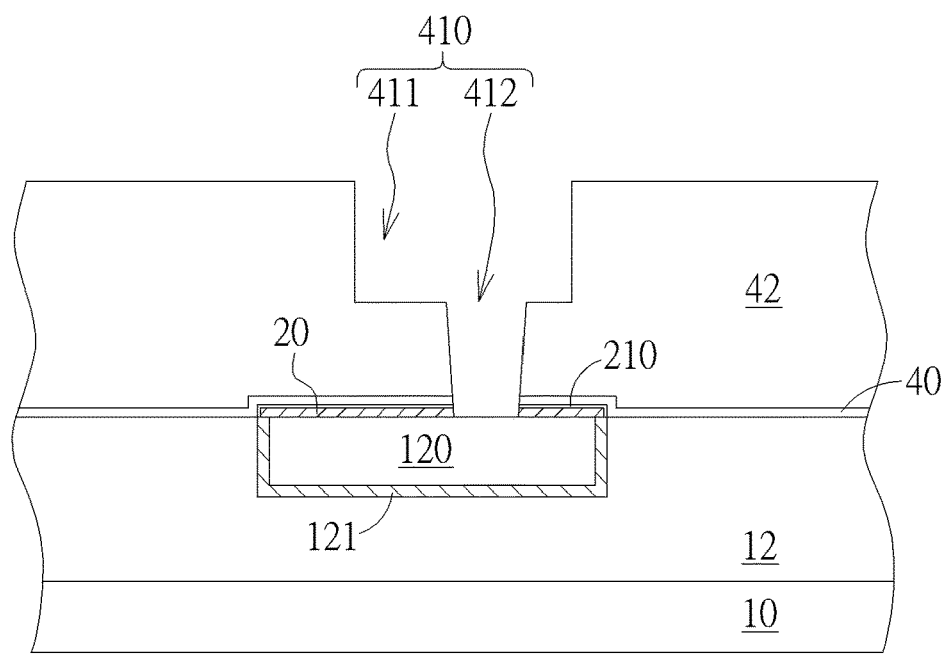
Figure 6:
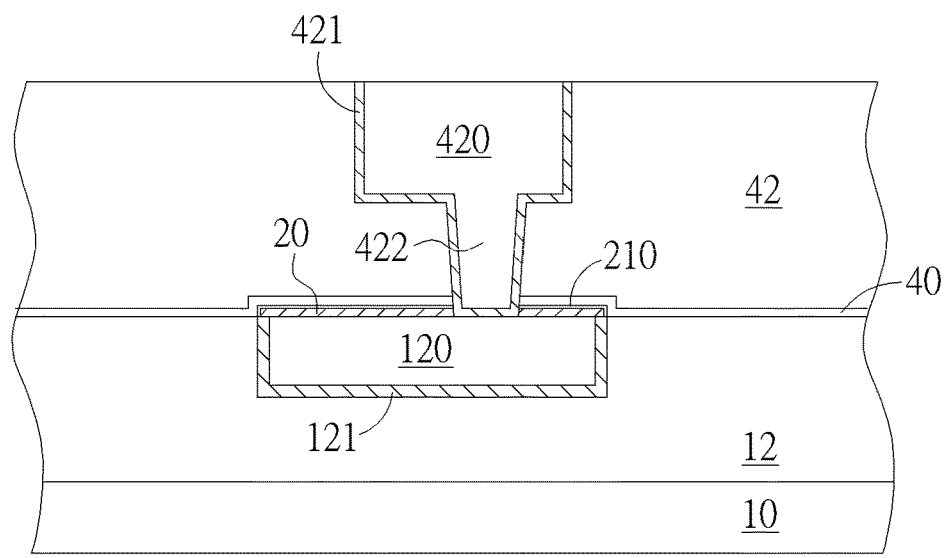

As shown in FIG. 5 and FIG. 6, a copper damascene process is performed. For example, a trench structure 410 is formed in the dielectric layer 42 and the etch stop layer 40, including a wire trench 411 and a via hole 412. The via hole 412 may penetrate the nitrogen-doped cobalt layer 210 and the cobalt cap layer 20 to partially expose the top surface 120a of the conductor 120.

Next, a barrier layer 421, such as tantalum or tantalum nitride, is conformally deposited on the surface of the trench structure 410, but is not limited thereto. Then, a copper seed layer (not shown) may be deposited, and a copper wire structure 420 may be formed in the trench structure 410 by electroplating. The copper wire structure 420 may be electrically connected to the underlying conductor 120 via an integrally formed copper via 422.

Figure 7:
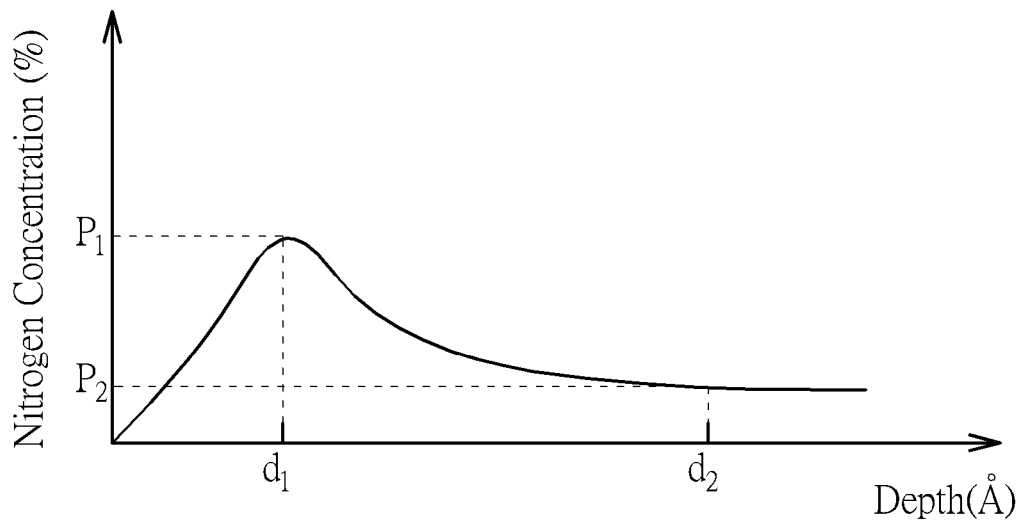
FIG. 7 shows that the nitrogen-doped cobalt layer has a gradient dopant (nitrogen) concentration distribution in its thickness.

According to an embodiment of the present invention, the nitrogen-doped cobalt layer 210 has a gradient dopant (nitrogen) concentration distribution across its thickness, as shown in FIG. 7. According to an embodiment of the present invention, the nitrogen-doped cobalt layer 210 has a first nitrogen doping concentration $P_1$ at a shallower depth, for example, the depth $d_1$ in FIG. 7, which is closer to the top surface of the nitrogen-doped cobalt layer 210. The nitrogen-doped cobalt layer 210 has a second nitrogen doping concentration $P_2$ at a deeper depth, for example, the depth $d_2$ in FIG. 7, which is adjacent to the cobalt cap layer 20. The first nitrogen doping concentration $P_1$ is greater than the second nitrogen doping concentration $P_2$. For example, the depth $d_1$ may be between 0 and 10 angstroms, and the first nitrogen doping concentration $P_1$ may be between 20 and 30 atomic percent.

Figure 8:
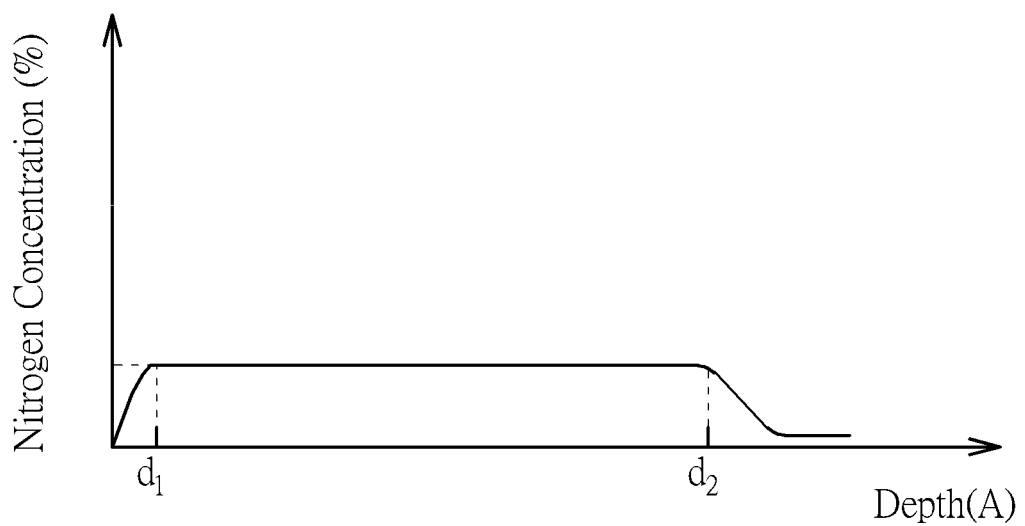
FIG. 8 shows that the nitrogen-doped cobalt layer has a uniform dopant (nitrogen) concentration distribution in its thickness.

According to another embodiment of the present invention, the nitrogen-doped cobalt layer 210 has a uniform dopant (nitrogen) concentration distribution across its thickness, as shown in FIG. 8. According to an embodiment of the present invention, the nitrogen-doped cobalt layer 210 has a first nitrogen doping concentration $P_1$ at a shallower depth, for example, the depth $d_1$ in FIG. 8, which is closer to the top surface of the nitrogen-doped cobalt layer 210. The nitrogen-doped cobalt layer 210 has a second nitrogen doping concentration $P_2$ at a deeper depth, for example the depth $d_2$ in FIG. 8, which is adjacent the cobalt cap layer 20. The first nitrogen doping concentration $P_1$ is approximately equal to the second nitrogen doping concentration $P_2$ between the depth $d_1$ and the depth $d_2$. In FIG. 8, the nitrogen doping concentration between depth $d_1$ and depth $d_2$ is approximately fixed (approximately a constant value).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An interconnect structure, comprising:
a dielectric layer;
a conductor embedded in the dielectric layer, wherein a top surface of the conductor is flush with a top surface of the dielectric layer;
a cobalt cap layer disposed on the top surface of the conductor; and
a nitrogen doped cobalt layer disposed on the cobalt cap layer, wherein the nitrogen doped cobalt layer has a uniform doping profile across a thickness of the nitrogen doped cobalt layer, wherein a copper wire structure, comprising a second barrier layer and an integrally formed copper via, directly penetrates through the cobalt cap layer and directly contacts the conductor; and wherein the cobalt cap layer directly contacts the barrier layer, wherein the nitrogen doped cobalt layer has a uniform doping profile across a thickness of the nitrogen doped cobalt layer, the nitrogen doped cobalt layer has a first nitrogen doping concentration adjacent to a top surface of the nitrogen doped cobalt layer and a second nitrogen doping concentration adjacent to the cobalt cap layer, and the first nitrogen doping concentration is substantially equal to the second nitrogen doping concentration, wherein a bottom surface of the barrier layer is flush with a top surface of the conductor.

2. The interconnect structure according to claim 1, wherein the thickness of the nitrogen doped cobalt layer ranges between 0-50 angstroms.

3. The interconnect structure according to claim 1, wherein the conductor comprises copper.

4. The interconnect structure according to claim 1, wherein the conductor is encased by a barrier layer.

5. The interconnect structure according to claim 4, wherein the barrier layer comprises tantalum or tantalum nitride.

6. The interconnect structure according to claim 1 further comprising an etch stop layer in direct contact with the nitrogen doped cobalt layer.

7. The interconnect structure according to claim 6, wherein the etch stop layer comprises SiCN, SiC, SiON, SiCON, or SiN.

8. The interconnect structure according to claim 1, wherein the dielectric layer comprises low-k dielectric or ultra-low k dielectric.

* * * * *